United States Patent
Li

(10) Patent No.: US 6,894,217 B2
(45) Date of Patent: May 17, 2005

(54) ELECTRONIC DEVICE

(75) Inventor: Chao-Kang Li, Hsichih (TW)

(73) Assignee: Aopen Inc., Taipei Hsien (TW)

( * ) Notice: Subject to any disclaimer, the term of this patent is extended or adjusted under 35 U.S.C. 154(b) by 0 days.

(21) Appl. No.: 10/683,960

(22) Filed: Oct. 10, 2003

(65) Prior Publication Data

US 2004/0245007 A1 Dec. 9, 2004

(30) Foreign Application Priority Data

Jun. 6, 2003 (TW) .................................. 92115355 A

(51) Int. Cl.⁷ .................................................. H05K 9/00
(52) U.S. Cl. ..................... 174/35 R; 361/753; 361/758
(58) Field of Search .......................... 174/35 R, 35 GC, 174/35 MS; 361/752, 753, 758, 759, 799, 800, 301, 804, 816, 818

(56) References Cited

U.S. PATENT DOCUMENTS

| | | | | |
|---|---|---|---|---|
| 5,106,225 A | * | 4/1992 | Andre et al. ............. | 403/408.1 |
| 5,191,513 A | * | 3/1993 | Sugiura et al. ............. | 361/752 |
| 5,281,149 A | * | 1/1994 | Petri ............................ | 439/66 |
| 5,452,184 A | * | 9/1995 | Scholder et al. ............ | 361/799 |
| 5,833,480 A | * | 11/1998 | Austin ......................... | 439/95 |
| 5,978,232 A | * | 11/1999 | Jo ................................ | 361/796 |
| 6,424,540 B1 | * | 7/2002 | Chen et al. ................. | 361/759 |

* cited by examiner

*Primary Examiner*—Dean A. Reichard
*Assistant Examiner*—Carmelo Oliva
(74) *Attorney, Agent, or Firm*—Quintero Law Office

(57) ABSTRACT

An electronic device and a fastening apparatus in the electronic device. The device includes a main board, a shield and a supporting seat. The shield has a first opening and a second opening. The supporting seat includes a first engaging portion, a second engaging portion and a third engaging portion. The supporting seat connects with the shield by the first and second engaging portion and supports the main board by the third engaging portion. The first engaging portion connects to the first opening to prevent the supporting seat from moving along the X and Z axes and the second engaging portion connects to the second opening to prevent the supporting seat from moving along the Y axis. The X, Y, and Z axes are perpendicular to each other.

30 Claims, 12 Drawing Sheets

ELECTRONIC DEVICE

BACKGROUND OF THE INVENTION

1. Field of the Invention

The present invention relates in general to an electronic device and in particular to a fastening apparatus in the electronic device to fix a main board on a shield.

2. Description of the Prior Art

A conventional method of fixing a main board 12 to a shield 11 is shown in FIGS. 1a and 1b. The main board 12 is connected to the shield 11 by several screws 13 and copper shafts 14. The shield 11 has plurality of first threaded holes 111 by which a threaded post 141 of the copper shaft 14 is connected thereto, each copper shaft 14 has a second threaded hole 142, and the main board 12 has plurality of third threaded holes 121. The screw 13 engages the third threaded holes 121 and the second threaded hole 142, such that the main board 12 is connected and fixed to the shield 11.

Another conventional method of fixing a main board 16 to a shield 15 is shown in FIGS. 1c and 1d. The main board 16 is connected to the shield 15 by several supporting elements 17. The shield 15 has plurality of openings 151 and the main board 16 has plurality of through holes 161. The supporting element 17 is composed of elastic material and passes through the opening 15 to be fixed on the shield 15. The supporting element 17 has a neck portion engaging the through holes 161, such that the main board 16 is connected and fixed to the shield 15.

In the first method mentioned above, the main board is connected to the shield by screws and copper shafts such that the fabrication process is difficult and lengthy. In the second method, a special tool is required to release the main board and the shield and is also inconvenient.

SUMMARY OF THE INVENTION

An object of the present invention is to provide an electronic device and a fastening apparatus in the electronic device that solves the above mentioned problem.

The electronic device of the present invention includes a main board, a shield and a supporting seat. The shield has a first opening and a second opening. The supporting seat includes a first engaging portion, a second engaging portion and a third engaging portion. The supporting seat connects to the shield by the first and second engaging portion and supports the main board by the third engaging portion. The first engaging portion connects to the first opening to prevent the supporting seat from moving along an X axis and the Z axis and the second engaging portion connects to the second opening to prevent the supporting seat from moving along the Y axis. The X, Y, and Z axes are perpendicular to each other.

The supporting seat further includes a flat body by which the first engaging portion is extended and the second engaging portion is disposed thereon.

The third engaging portion is disposed on the body.

The supporting seat further includes a release member disposed on the body to release the supporting seat and the shield.

The third engaging portion has a threaded hole and the main board has a through hole, a screw passes through the through hole and engages the threaded hole to connect the main board and the supporting seat.

The main board has a through hole so that the third engaging portion engages the through hole to connect the main board and the supporting seat.

The third engaging portion is L-shaped.

The device further includes a fixing assembly disposed on the shield, wherein the supporting seat prevents the main board from moving along the X and Z axes and the fixing assembly prevents the main board from moving along the Y axis.

The fixing assembly includes a base and a sliding clip disposed on the base.

The base has a rack and the clip includes a tooth and a tongue, wherein the tooth engages the rack such that the fixing assembly holds the main board, and the tongue releases the tooth from the rack.

The base further includes a track to hold the clip on the base.

The clip further includes a recess to hold the main board at a predetermine position.

The supporting seat is composed of metal.

The supporting seat is composed of plastic and the electronic device further includes a metal component to cover the supporting seat.

Another object of the present invention is to provide a fastening apparatus. The fastening apparatus includes a first opening, a second opening and supporting seat. The first and second openings are disposed on the shield. The supporting seat includes a first engaging portion, a second engaging portion and a third engaging portion. The supporting seat connects to the shield by the first and second engaging portions and supports the main board by the third engaging portion. The first engaging portion connects to the first opening to prevent the supporting seat from moving along the X and Z axes and the second engaging portion connects to the second opening to prevent the supporting seat from moving along the Y axis. The X, Y, and Z axes are perpendicular to each other.

The supporting seat further includes a flat body by which the first engaging portion is extended and the second engaging portion is disposed thereon.

The third engaging portion is disposed on the body.

The supporting seat further includes a release member disposed on the body to release the supporting seat and the shield The third engaging portion has a threaded hole and the main board has a through hole, a screw passes through the through hole and engages the threaded hole to connect the main board and the supporting seat.

The main board has a through hole so that the third engaging portion engages the through hole to connect the main board and the supporting seat.

The third engaging portion is L-shaped.

The fastening apparatus further includes a fixing assembly disposed on the shield, wherein the supporting seat prevents the main board from moving along the X and Z axes and the fixing assembly prevents the main board from moving along the Y axis.

The fixing assembly includes a base and a sliding clip disposed on the base.

The base has a rack and the clip includes a tooth and a tongue, the tooth engages the rack such that the fixing assembly holds the main board, and the tongue is to release the tooth from the rack.

The base further includes a track to hold the clip on the base.

The clip further includes a recess to hold the main board at a predetermine position.

The supporting seat is composed of metal.

The supporting seat is composed of plastic and the electronic device further includes a metal component to cover the supporting seat.

DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1A:
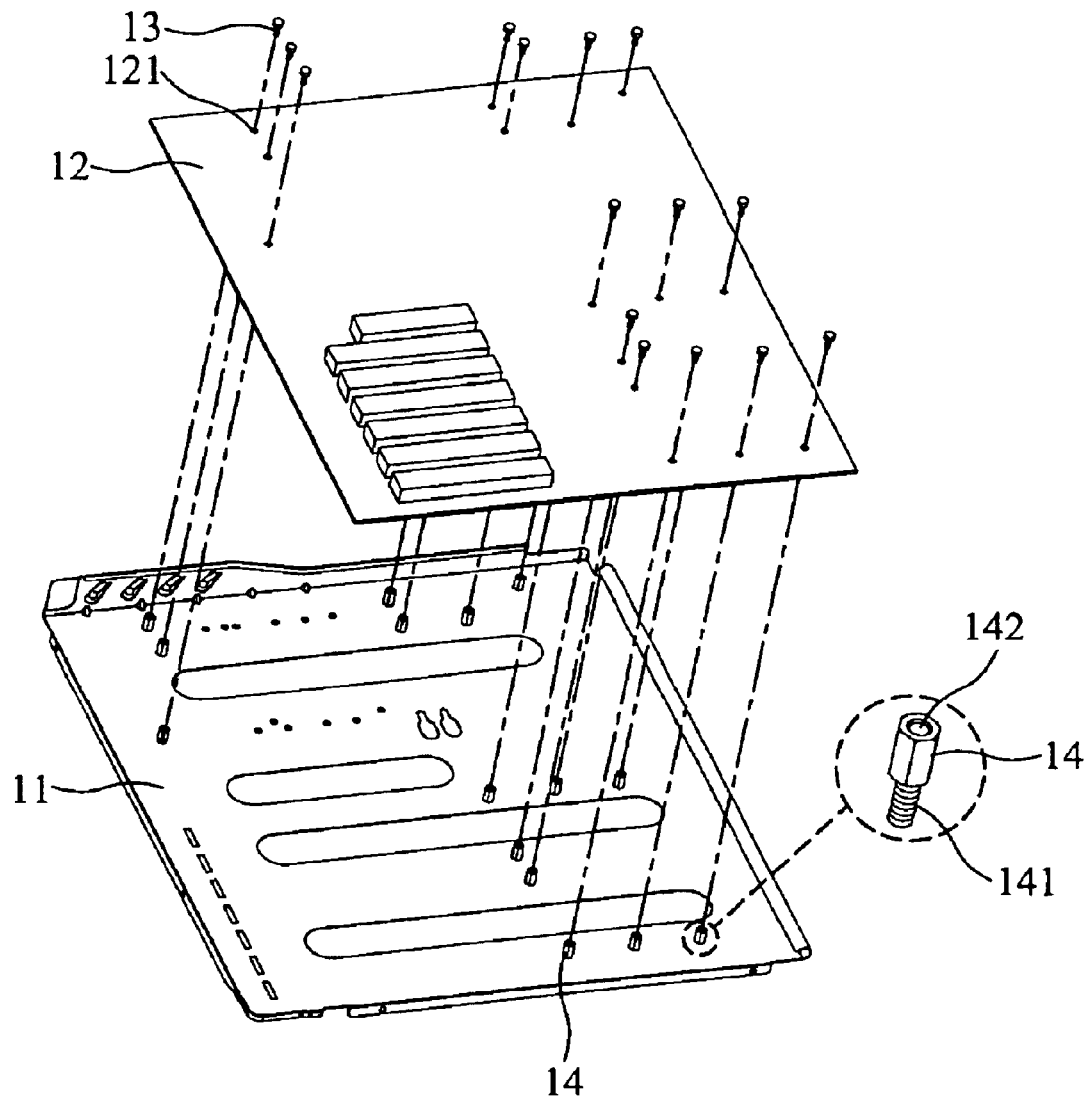
FIG. 1a is a schematic diagram showing a conventional method of fixing a main board to a shield.
Figure 1B:
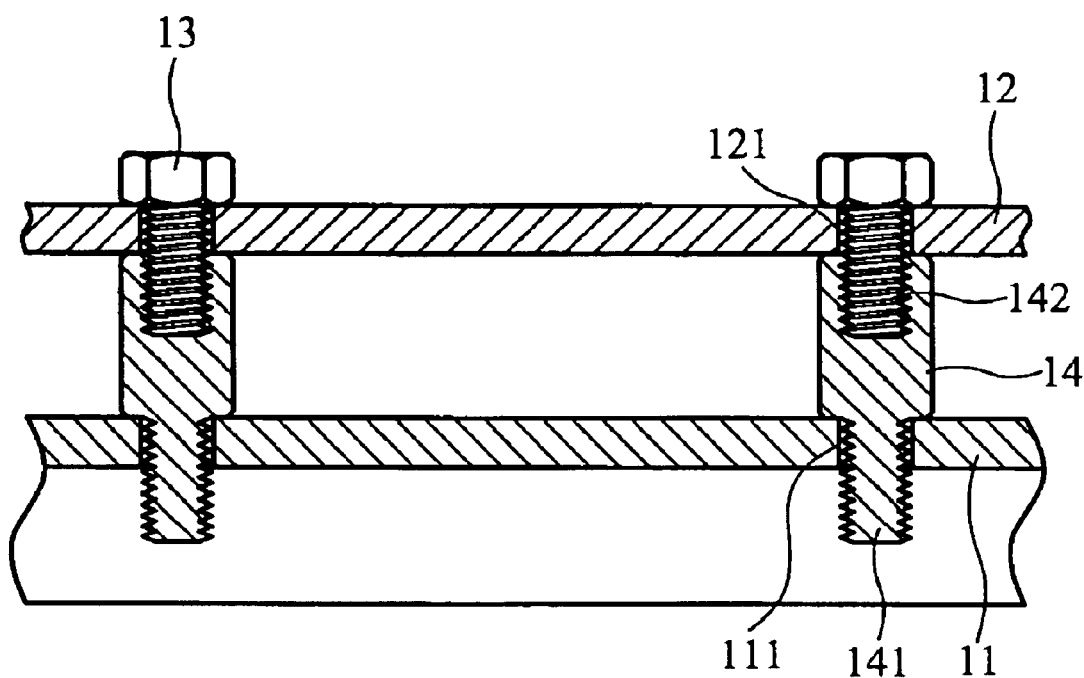
FIG. 1b is a cross section of FIG. 1a showing the main board fixed on the shield.
Figure 1C:
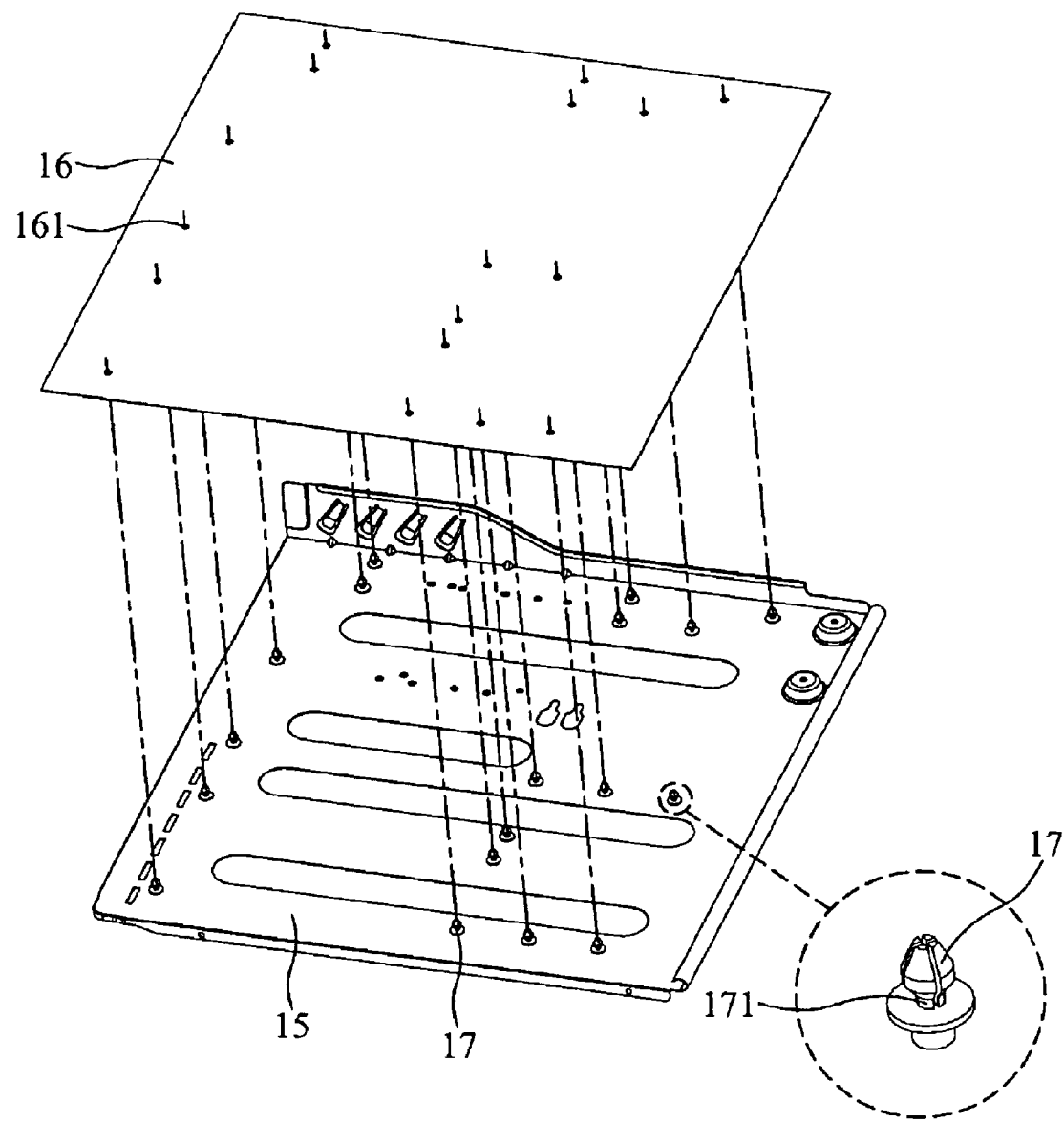
FIG. 1c is a schematic diagram showing another conventional method of fixing a main board to a shield.
Figure 1D:
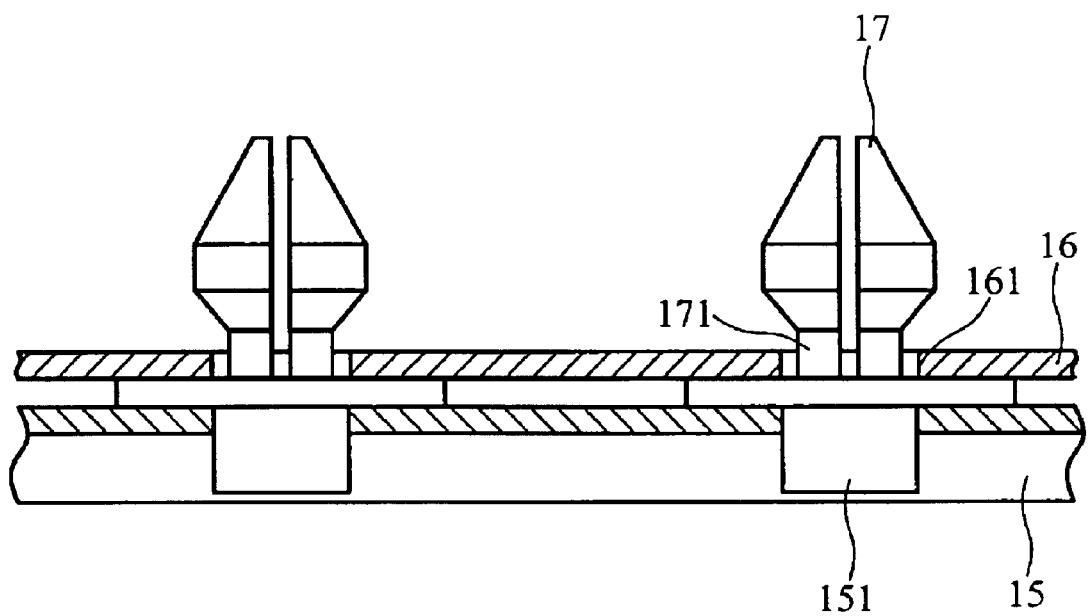
FIG. 1d is a cross section of FIG. 1c showing the main board fixed on the shield.
Figure 2A:
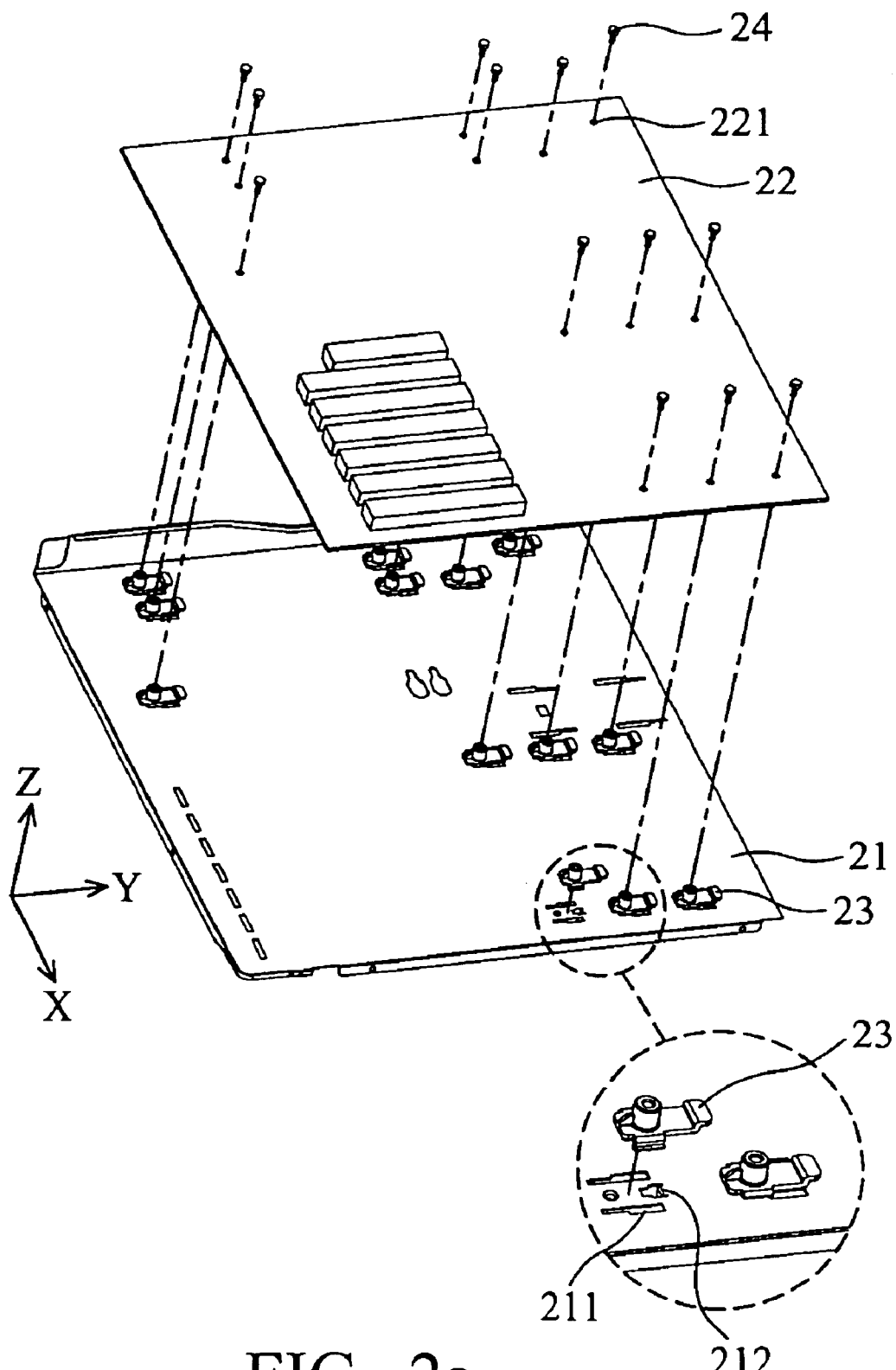
FIG. 2a is a schematic diagram showing an electronic device and a fastening apparatus in the electronic device of the present invention.
Figure 2B:
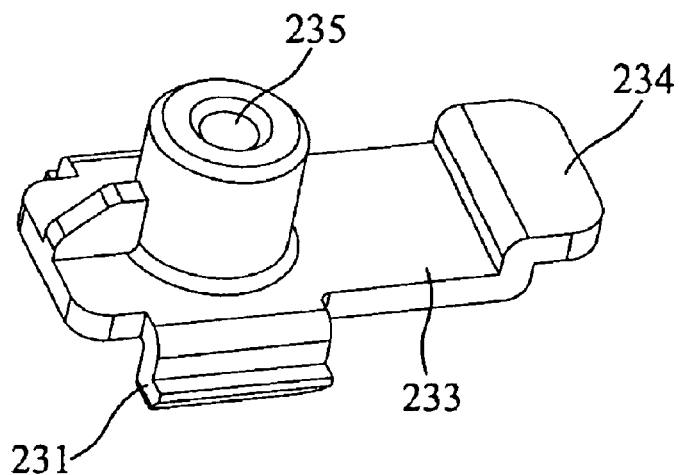
FIG. 2b is a schematic diagram showing a supporting seat of the present invention.
Figure 2C:
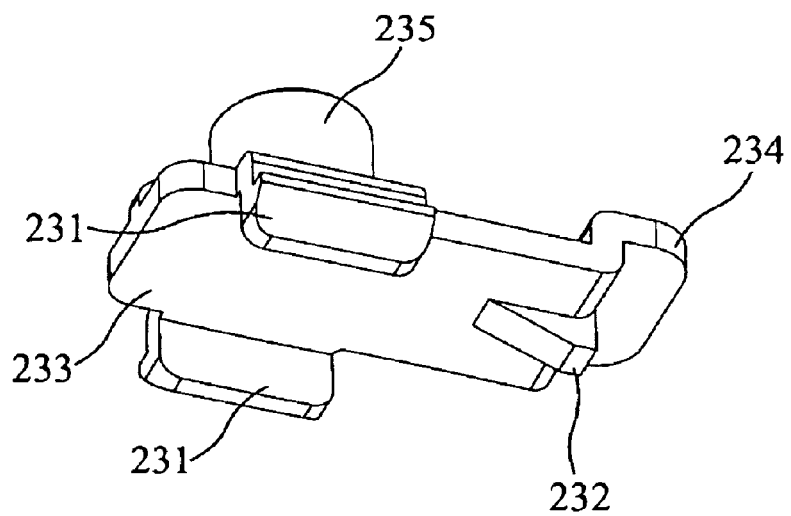
FIG. 2c is another schematic diagram showing the supporting seat of the present invention.

The electronic device and fastening apparatus of the present invention are shown in FIGS. 2a, 2b, and 2c. The electronic device includes a main board 22, a shield 21 and a supporting seat 23. There are several through holes on the main board 22. The shield 21 has two first openings 211 and 211 and a second opening 212. The supporting seat 23 has two first engaging portions 231 and 231, a second engaging portion 232 and a third engaging portion 235.

The supporting seat 23, as shown in FIGS. 2b and 2c, has a flat body 233, and two first engaging portions 231 and 231 extend from both edges of the flat body 233 to form an elastic structure. When engaging with the first opening 211 of the shield 21, the first engaging portion 231 provides a clamping force to prevent the supporting seat 23 from moving along the X and Z axes (shown in FIG. 2a). The second engaging portion 232 is disposed on the bottom of the body 233 of the supporting seat 23. When the second engaging portion 232 engages the second opening 212 of the shield 21, it prevents the supporting seat 23 from moving along the Y axis. Additionally, a release member 234 is extended from the end of the supporting seat 23 and the third engaging portion 235 is disposed on top of the body 233.

The shape of the first opening 211 on the shield 21 can be formed as shown in FIG. 2a which has a wide end and a narrow end. The wide end allows the first engaging portion 231 to pass through and then pushes the first engaging portion 231 toward the narrow end along the Y axis, and finally the first engaging portion 231 engages the first opening 211 at the narrow end. The elastic structure of the first engaging portion 231 provides the clamping force to prevent the supporting seat 23 from moving along the X and Z axes. Meanwhile, the second engaging portion 232 engages the second opening 212 to prevent the supporting seat 23 from moving along the Y axis. Finally, the supporting seat 23 is fixed on the shield 21.

The supporting seat 23 is disconnected from the shield 21 by raising the release member 234 along the Z axis so that the second engaging portion 232 disconnects from the second opening 212. Thereafter, the release member 234 is pulled along the Y axis (toward the right side of the FIG. 2a) so that the first engaging portion 231 moves from the narrow end of the first opening 211 to the wide end. Finally, the supporting seat 23 can be removed and disconnected from the shield 21.

The third engaging portion 235 of the supporting seat 23, as shown in FIGS. 2b and 2c, has a threaded hold. A screw passes through the through hole 221 of the main board 22 and engages the threaded hold such that the main board 22 is connected to the supporting seat 23.

Figure 2D:
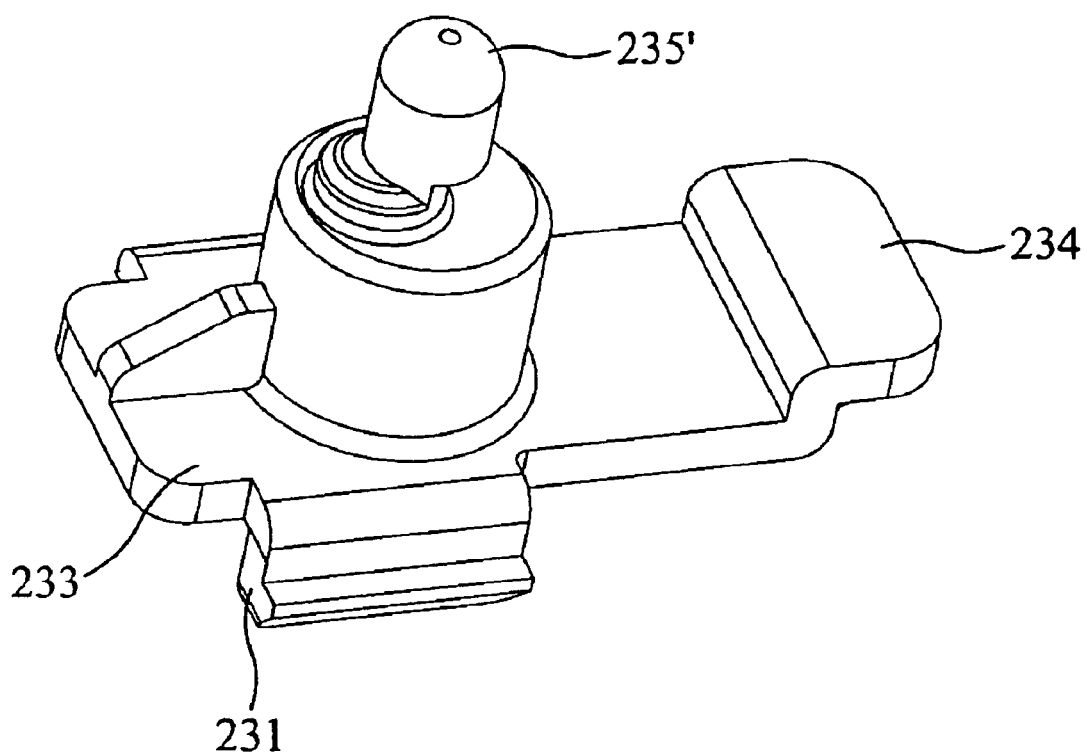
FIG. 2d is a schematic diagram showing another supporting seat of the present invention.
Figure 2E:
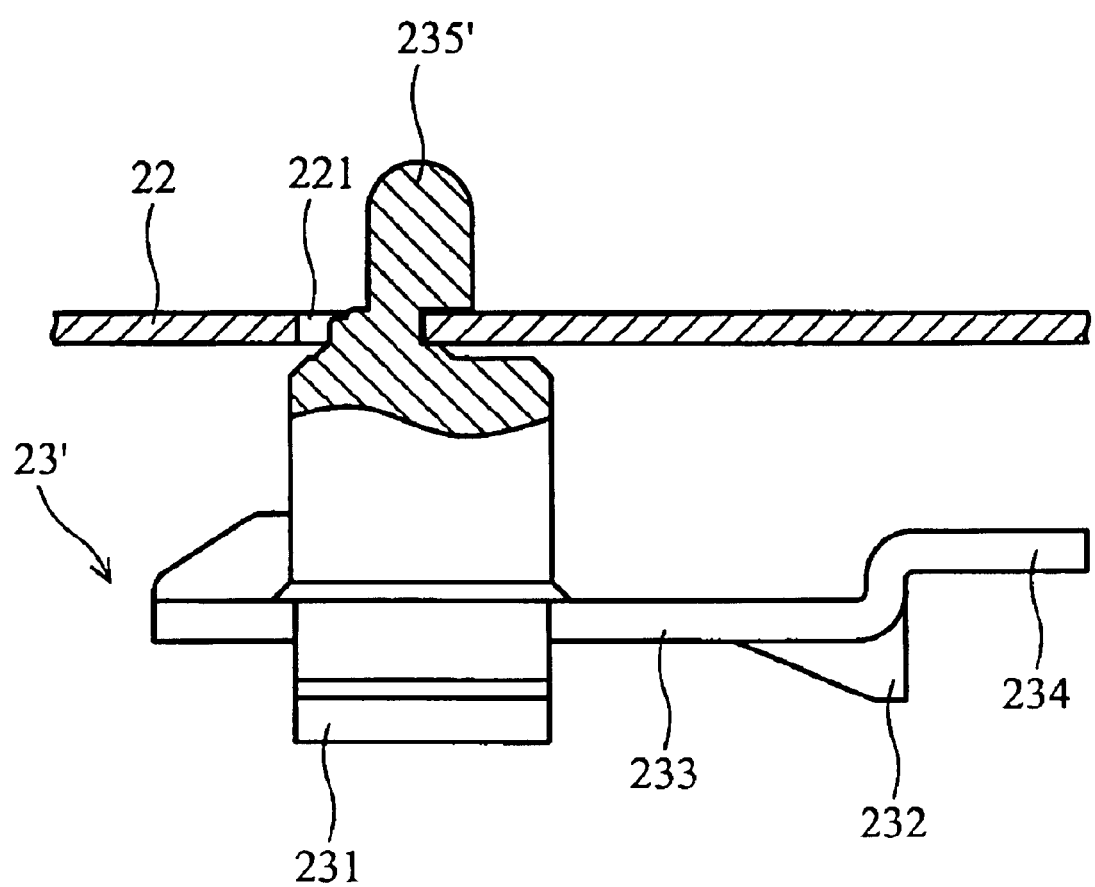
FIG. 2e is another schematic diagram showing the supporting seat of the present invention.

Additionally, the third engaging portion 235' of supporting seat 23' can be L-shaped as shown in FIGS. 2d and 2e as so that the third engaging portion 235' directly hooks and connects the through hole 221 of the main board 22 as shown in FIG. 2e. Finally, the main board 22 is connected to the supporting seat 23'.

The component of the electronic device and the fastening apparatus in the electronic device of the present invention is described above, then the assembly process of the present invention is described in the following.

As shown in FIG. 2a, the main board 22 connects to the shield 21 by the supporting seat 23 as shown in FIGS. 2b and 2c, first, the supporting seat 23 engages the shield 21 as mentioned above, then a screw 24 passes through the through hole 221 of the main board 22 and engages the threaded hole so that the main board 22 connects to the supporting seat 23, finally, the main board 22 connects to the shield 21 completing the assembly process.

Figure 3:
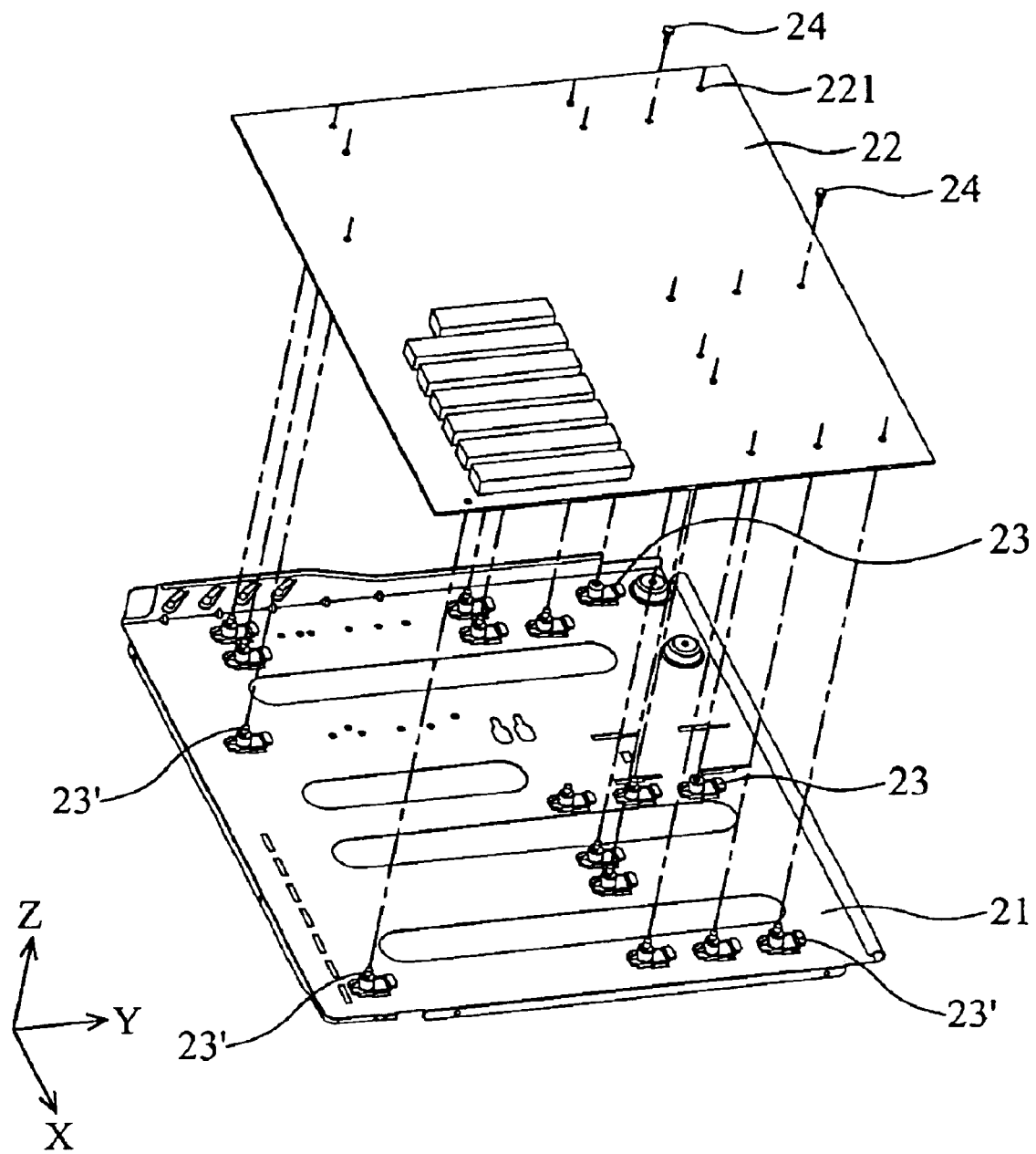
FIG. 3 is a schematic diagram showing an electronic device and a fastening apparatus in the electronic device of the present invention.

Referring to FIG. 3, the second embodiment utilizes the supporting seat 23 as shown in FIGS. 2b and 2c and the supporting seat 23' as shown in FIGS. 2d and 2e at the same time. Similarly, the main board 22 is connected to the shield 21 by the supporting seat 23 and the supporting seat 23', first, the supporting seat 23 and the supporting seat 23' engages the shield 21 as mentioned above, then a screw 24 passes through the through hole 221 of the main board 22 and engages the threaded hole of the third engaging portion 235 of the supporting seat 23 so that the supporting seat 23 and the supporting seat 23' connect to the main board 22, finally, the main board 22 connects to the shield 21 and the assembly process is finished. Due to the L-shaped third engaging portion 235' of the supporting seat 23', a screw is not required to engage the main board 22 reducing the number of screws required.

Figure 4A:
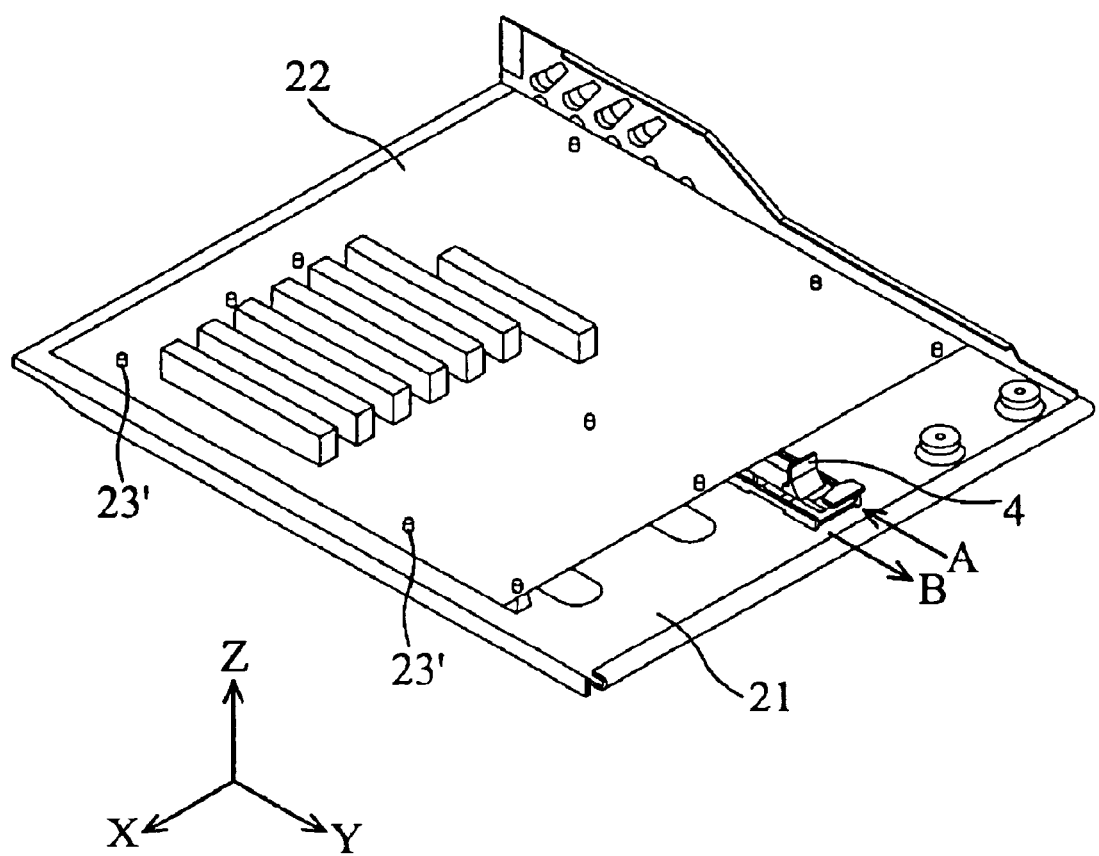
FIG. 4a is a schematic diagram showing an electronic device and a fastening apparatus in the electronic device of the present invention.

Referring to FIG. 4a, the third embodiment totally utilizes the supporting seat 23' as shown in FIGS. 2d and 2e to connect the main board 22 to the shield 21 without screws. First, the supporting seat 23' engages the shield 21 as mentioned above, the main board 22 is then connected to the supporting seat 23' so that the supporting seat 23' prevents the main board 22 from moving along the X and Z axes. Meanwhile, a fixing assembly 4 is disposed on the shield 21 and slides in the directions indicated by arrows A and B as shown in FIG. 4a. The fixing assembly 4 prevents the main board 22 from moving along the Y axis so that the main board 22 is fixed to the shield 21 without requiring screws.

Figure 4B:
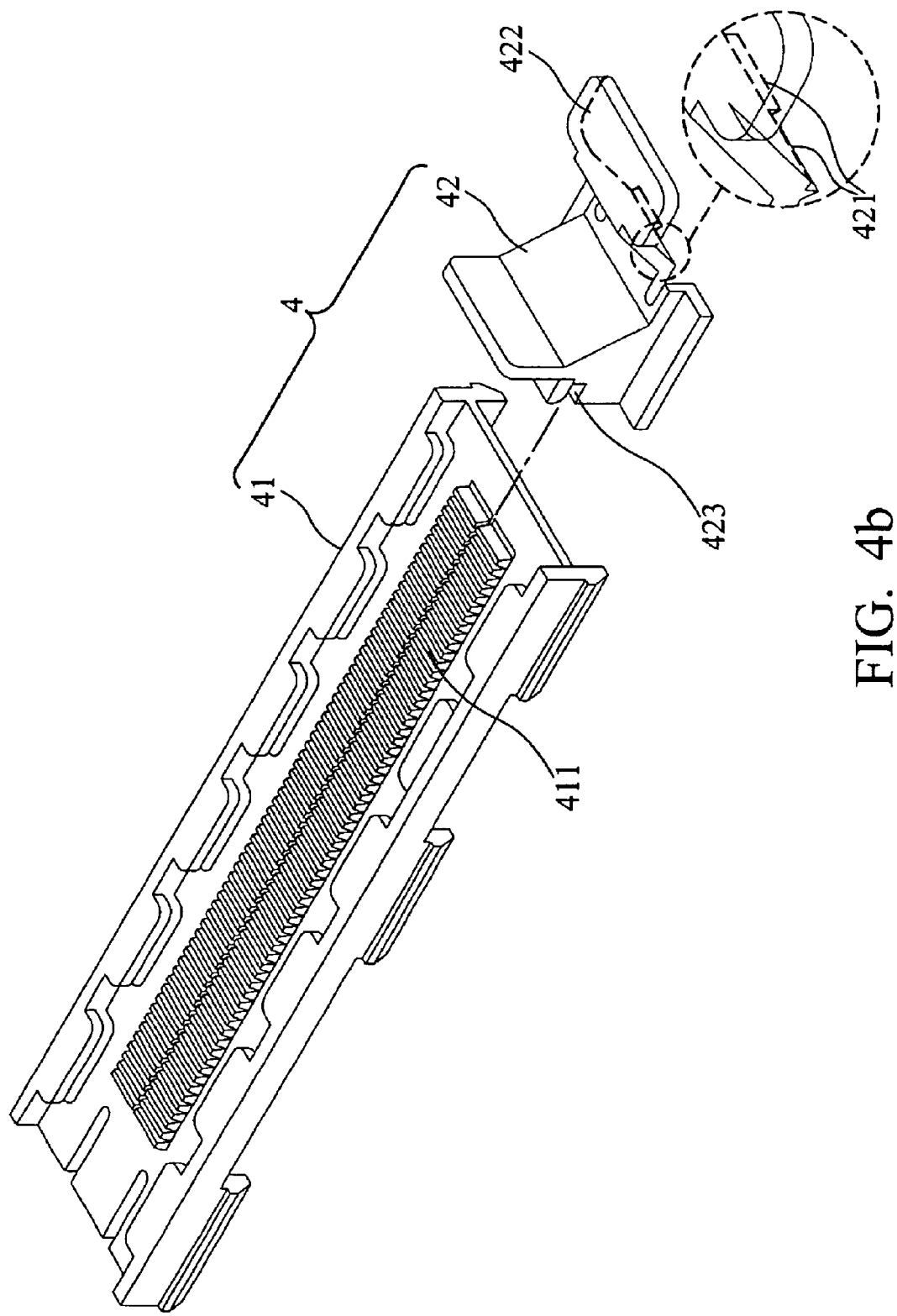
FIG. 4b is a schematic diagram showing a fixing assembly of the present invention.
Figure 4C:
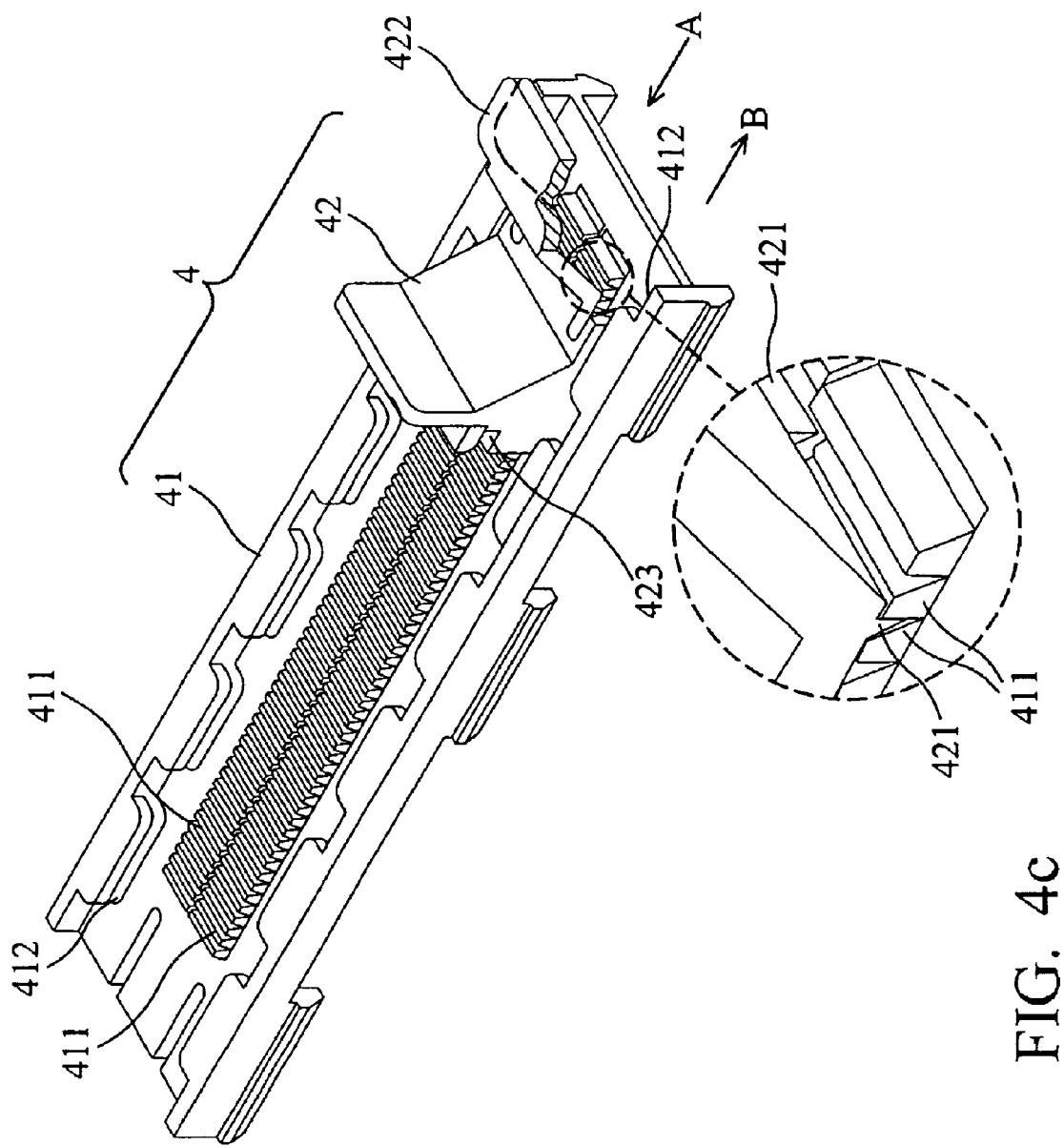
FIG. 4c is a schematic diagram showing the fixing assembly of the present invention.

An example of the fixing assembly 4 is shown in FIGS. 4b and 4c. The fixing assembly 4 includes a base 41 and a clip 42. The clip 42 is disposed in and able to slide in the base 41. Two rows of rack 411 and two tracks 412 and 412 are arranged in the base. The clip 42 has two teeth 421, a tongue 422 and a recess 423. The rack 411 and the tooth 421 are face opposite directions. The clip 42 moves along the arrow A and the tooth 421 of the clip 42 engages the rack 411 of the base 41 until the clip 42 holds the main board 22. The tongue 422 of the clip 42 is to disengage the rack 411 and the tooth 421. The tongue 422 can be formed as a handle, thus, the tongue 422 is raised so that the tooth 421 is lifted and the tooth 421 disconnects from the rack 411. Afterward, the clip 42 is pulled in the direction indicated by arrow B to disengage the clip 42 and the main board 22. Additionally, the recess 423 of the clip 42 retains the main board 22 at a predetermined position so that the recess 423 can be formed as shown in FIGS. 4a and 4b. The track 412 secures the clip 42 on the base 41.

As mentioned above, according to the mechanical inclined plane theorem, the clip 42 with the tooth 411 can move along arrow A in the base 41 but not along arrow B because the rack 411 and the tooth 421 obstruct each other, thus preventing motion of the clip 41. Namely, the clip 41 can only move in one direction along the arrow A but cannot move along the arrow B without the tongue 422 operating as mentioned above. Finally, the clip 41 holds the main board 22.

Furthermore, to prevent electromagnetic interference (EMI), the supporting seat 23 and the supporting seat 23' are preferably composed of metal.

When the supporting seat 23 and the supporting seat 23' are plastic, they are preferably covered by a metal layer outside the supporting seat 23 and the supporting seat 23' to further prevent electromagnetic interference (EMI) in the electronic device.

As mentioned above, the electronic device and the fastening apparatus in the electronic device of the present invention, the supporting seat engages the shield without screws. Thereafter, the main board engages the supporting seat to fix the main board to the shield; the number of screws required is reduced or even eliminated. Thus, assembly time and costs are reduced.

Finally, while the invention has been described by way of example and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electronic device, comprising:
a main board;
a shield having a first opening and a second opening; and
a supporting seat including a first engaging portion, a second engaging portion, a third engaging portion and a release member, connected to the shield by the first and second engaging portions, supporting the main board by the third engaging portion, and released from the shield by the release member,
wherein the first engaging portion connects to the first opening to prevent the supporting seat from moving along the X and Z axes, the second engaging portion connects to the second opening to prevent the supporting seat from moving along the Y axis, and the X, Y, and Z axes are perpendicular to each other.

2. The electronic device as claimed in claim 1, wherein the supporting seat further comprises a flat body by which the first engaging portion is extended and the second engaging portion is disposed thereon.

3. The electronic device as claimed in claim 2, wherein the third engaging portion is disposed on the body.

4. The electronic device as claimed in claim 2, wherein the release member is disposed on the body to release the supporting seat and the shield.

5. The electronic device as claimed in claim 4, wherein the third engaging portion has a threaded hole and the main board has a through hole, a screw passes through the through hole and engages the threaded hole to connect the main board and the supporting seat.

6. The electronic device as claimed in claim 4, wherein the main board has a through hole so that the third engaging portion engages the through hole to connect the main board and the supporting seat.

7. The electronic device as claimed in claim 6, wherein the third engaging portion is L-shaped.

8. The electronic device as claimed in claim 6, further comprises a fixing assembly disposed on the shield, wherein the supporting seat prevents the main board from moving along the X and Z axes and the fixing assembly prevents the main board from moving along the Y axis.

9. The electronic device as claimed in claim 8, wherein the fixing assembly comprises a base and a sliding clip disposed on the base.

10. The electronic device as claimed in claim 9, wherein the base has a rack and the clip comprises a tooth and a tongue, the tooth engages the rack such that the fixing assembly holds the main board, and the tongue is to release the tooth from the rack.

11. The electronic device as claimed in claim 10, wherein the base further comprises a track to hold the clip on the base.

12. The electronic device as claimed in claim 11, wherein the clip further comprises a recess to hold the main board at a predetermined position.

13. The electronic device as claimed in claim 1, wherein the supporting seat is composed of metal.

14. The electronic device as claimed in claim 1, wherein the supporting seat is composed of plastic and the electronic device further comprises a metal component to cover the supporting seat.

15. A fastening apparatus for connecting a main board to a shield, comprising:
a first opening disposed at the shield;
a second opening disposed at the shield; and
a supporting seat including a first engaging portion, a second engaging portion, a third engaging portion and a release member, connected to the shield by the first and second engaging portions, supporting the main board by the third engaging portion, and released from the shield by the release member, wherein the first engaging portion connects to the first opening to prevent the supporting seat from moving along the X and Z axes, the second engaging portion connects to the second opening to prevent the supporting seat from moving along the Y axis, and the X, Y, and Z axes are perpendicular to each other.

16. The fastening apparatus as claimed in claim 15, wherein the supporting seat further comprises a flat body by which the first engaging portion is extended and the second engaging portion is disposed thereon.

17. The fastening apparatus as claimed in claim 16, wherein the third engaging portion is disposed on the body.

18. The fastening apparatus as claimed in claim 16, wherein the release member is disposed on the body to release the supporting seat and the shield.

19. The fastening apparatus as claimed in claim 18, wherein the third engaging portion has a threaded hole and the main board has a through hole, a screw passes through the through hole and engages the threaded hole to connect the main board and the supporting seat.

20. The fastening apparatus as claimed in claim 18, wherein the main board has a through hole so that the third engaging portion engages the through hole to connect the main board and the supporting seat.

21. The fastening apparatus as claimed in claim 20, wherein the third engaging portion is L-shaped.

22. The fastening apparatus as claimed in claim 20 further comprises a fixing assembly disposed on the shield, wherein the supporting seat is to prevent the main board from moving along the X and Z axes and the fixing assembly is to prevent the main board from moving along the Y axis.

23. The fastening apparatus as claimed in claim 22, wherein the fixing assembly comprises a base and a sliding clip disposed on the base.

24. The fastening apparatus as claimed in claim 23, wherein the base has a rack and the clip comprises a tooth and a tongue, the tooth engages the rack such that the fixing assembly holds the main board, and the tongue is to release the tooth from the rack.

25. The fastening apparatus as claimed in claim 24, wherein the base further comprises a track to hold the clip on the base.

26. The fastening apparatus as claimed in claim 25, wherein the clip further comprises a recess to hold the main board at a predetermined position.

27. The fastening apparatus as claimed in claim 15, wherein the supporting seat is composed of metal.

28. The fastening apparatus as claimed in claim 15, wherein the supporting seat is composed of plastic and the electronic device further comprises a metal component to cover the supporting seat.

29. An electronic device, comprising:
a main board having a through hole;
a shield having a first opening and a second opening;
a supporting seat including a flat body, a first engaging portion, a second engaging portion, a third engaging portion and a release member, the first engaging portion extended from the body, the second engaging portion and the release member disposed on the body, the supporting seat connected to the shield by the first and second engaging portions, supporting the main board by the third engaging portion, and released from the shield by the release member; and
a fixing assembly disposed on the shield,
wherein the first engaging portion connects to the first opening to prevent the supporting seat from moving along the X and Z axes, the second engaging portion connects to the second opening to prevent the supporting seat from moving along the Y axis, and the X, Y, and Z axes are perpendicular to each other,
wherein the third engaging portion engages the through hole to connect the main board and the supporting seat,
wherein the supporting seat prevents the main board from moving along the X and Z axes and the fixing assembly prevents the main board from moving along the Y axis.

30. A fastening apparatus for connecting a main board having a through hole to a shield, comprising:
a first opening disposed at the shield;
a second opening disposed at the shield;
a supporting seat including a flat body, a first engaging portion, a second engaging portion, a third engaging portion and a release member, the first engaging portion extended from the body, the second engaging portion and the release member disposed on the body, tie supporting seat connected to the shield by the first and second engaging portions, supporting the main board by the third engaging portion, and released from the shield by the release member, and
a fixing assembly disposed on the shield,
wherein the first engaging portion connects to the first opening to prevent the supporting seat from moving along the X and Z axes, the second engaging portion connects to the second opening to prevent the supporting seat from moving along the Y axis, and the X, Y, and Z axes are perpendicular to each other,
wherein the third engaging portion engages the through hole to connect the main board and the supporting seat,
wherein the supporting seat prevents the main board from moving along the X and Z axes and the fixing assembly prevents the main board from moving along the Y axis.

* * * * *